(12) United States Patent
Reshetnyak et al.

(10) Patent No.: US 9,159,790 B2
(45) Date of Patent: Oct. 13, 2015

(54) DEVICE AND METHOD FOR CONTROLLING THE TURN-OFF OF A SOLID STATE SWITCH (SGTO)

(71) Applicants: Boris Reshetnyak, North Wales, PA (US); Victor Temple, Clifton Park, NY (US); Dante E. Piccone, Glenmoore, PA (US); Thomas R. Peterson, Laurys Station, PA (US)

(72) Inventors: Boris Reshetnyak, North Wales, PA (US); Victor Temple, Clifton Park, NY (US); Dante E. Piccone, Glenmoore, PA (US); Thomas R. Peterson, Laurys Station, PA (US)

(73) Assignee: Silicon Power Corporation, Clifton Park, NY (US)

( * ) Notice: Subject to any disclaimer, the term of this patent is extended or adjusted under 35 U.S.C. 154(b) by 0 days.

(21) Appl. No.: 14/182,629

(22) Filed: Feb. 18, 2014

(65) Prior Publication Data

US 2015/0236685 A1     Aug. 20, 2015

(51) Int. Cl.
*H01L 29/74* (2006.01)
*H01L 29/749* (2006.01)
*H01L 29/08* (2006.01)

(52) U.S. Cl.
CPC ............ *H01L 29/0834* (2013.01); *H01L 29/74* (2013.01); *H01L 29/749* (2013.01); *H01L 2924/1301* (2013.01)

(58) Field of Classification Search
CPC ................... H01L 2924/1301; H01L 29/0834; H01L 29/74; H01L 29/749; H01L 29/7436; H03K 17/08144; H03K 17/04123; H02H 7/12
See application file for complete search history.

(56) References Cited

U.S. PATENT DOCUMENTS

| | | | | |
|---|---|---|---|---|
| 3,678,367 A * | 7/1972 | McMurray | ................... | 363/10 |
| 3,938,027 A * | 2/1976 | Iwamoto | ................... | 363/124 |
| 4,827,321 A * | 5/1989 | Baliga | ................... | 257/133 |
| 4,868,731 A * | 9/1989 | Hobi | ................... | 363/54 |
| 5,514,921 A | 5/1996 | Steigerwald | | |
| 5,661,644 A * | 8/1997 | Bergman et al. | ........... | 363/56.01 |
| 6,128,324 A * | 10/2000 | Shah et al. | ................... | 372/50.22 |
| 6,191,640 B1 | 2/2001 | Coenraads et al. | | |
| 6,597,555 B2 * | 7/2003 | Gruening et al. | ............. | 361/100 |
| 7,692,211 B1 | 4/2010 | Temple et al. | | |

OTHER PUBLICATIONS

A. Schweizer et al., "Application Aspects," ABB Semiconductors AG, Section 5, pp. S5-1-S5-27.

* cited by examiner

*Primary Examiner* — Thomas L Dickey
*Assistant Examiner* — Gustavo Ramallo
(74) *Attorney, Agent, or Firm* — Blank Rome LLP

(57) ABSTRACT

A circuit for turning OFF a thyristor. The circuit includes at least one first circuit element configured to provide a high reverse turn-OFF voltage to the thyristor gate for a predetermined period of time. Immediately following the predetermined period of time, at least one second circuit element provides a normal reverse turn-OFF voltage to the thyristor gate. The normal reverse turn-OFF voltage is substantially lower than the high reverse turn-OFF voltage.

12 Claims, 7 Drawing Sheets

DEVICE AND METHOD FOR CONTROLLING THE TURN-OFF OF A SOLID STATE SWITCH (SGTO)

BACKGROUND OF THE INVENTION

1. Field of the Invention

The present invention relates to a method and device for controlling the turn-OFF of a solid state switch, and especially a thyristor. GTO or SGTO.

2. Background of the Related Art

Thyristors are turned ON by a gate signal. Once the gate signal is removed, the thyristor remains in the ON-state until the current flowing through the thyristor falls below a certain threshold value. Thus, Gate Turn-Off Thyristors (GTOs) can be turned ON by a gate signal of a positive current pulse between the gate and cathode terminals, and turned OFF by a gate signal of negative polarity between the gate and cathode terminals. However. GTOs suffer from long switch OFF times. After the turn-OFF current terminates, there is a long tail time where residual current continues to flow until all remaining charge from the device dissipates.

A number of devices have been developed to aid in the turn-OFF of thyristors, such as discussed in U.S. Pat. No. 6,191,640 to Coenraads et al., U.S. Pat. No. 6,597,555 to Gruening et al., U.S. Pat. No. 4,868,731 to Hobi, and U.S. Pat. No. 5,514,921 to Steigerwald. However, these patents do not improve the turn-OFF characteristics of the solid state switches. In addition the assignee, Silicon Power, turns OFF its Super Gate Turn-Off Thyristor (SGTO) by applying a −9 volt pulse.

One of the factors affecting the turn-OFF characteristics of the solid state switches is the gate current DIg/DT value which is limited by the gate drive circuit inductance, the gate inductance of the device and by the reverse blocking voltage capability of the gate-cathode junction (in the present case by −9V). So a turn-OFF pulse that exceeds the reverse blocking voltage capability of the gate-cathode junction (in our case by −9V) continuously will put the junction of the thyristor into avalanche breakdown and the gate drive will supply high current through junction. This will affect the solid state switches temperature and switches can be destroyed. To avoid that, designers will apply a −9 volt pulse to turn OFF a thyristor. Consequently, there is still a need to increase the turn-off current value and reduce the OFF times for GTOs.

SUMMARY OF THE INVENTION

Accordingly, it is one object of the invention to provide a system, method and circuit fir reducing the switch OFF times, turn-OFF losses, increase turn-OFF current value of solid state switches, and especially GTOs and super GTOs.

In accordance with these and other objects, a circuit is provided to turn OFF a thyristor having a gate. The circuit includes at least one first circuit element and a second circuit element. The first circuit element provides a first reverse turn-OFF voltage to the thyristor gate for a predetermined period of time. The second circuit element provides a second reverse turn-OFF voltage to the thyristor gate following the predetermined period of time. The second reverse turn-OFF voltage is substantially lower than the first reverse turn-OFF voltage.

These and other objects of the invention, as well as many of the intended advantages thereof, will become more readily apparent when reference is made to the following description, taken in conjunction with the accompanying drawings.

DETAILED DESCRIPTION OF THE PREFERRED EMBODIMENTS

Figure 1:
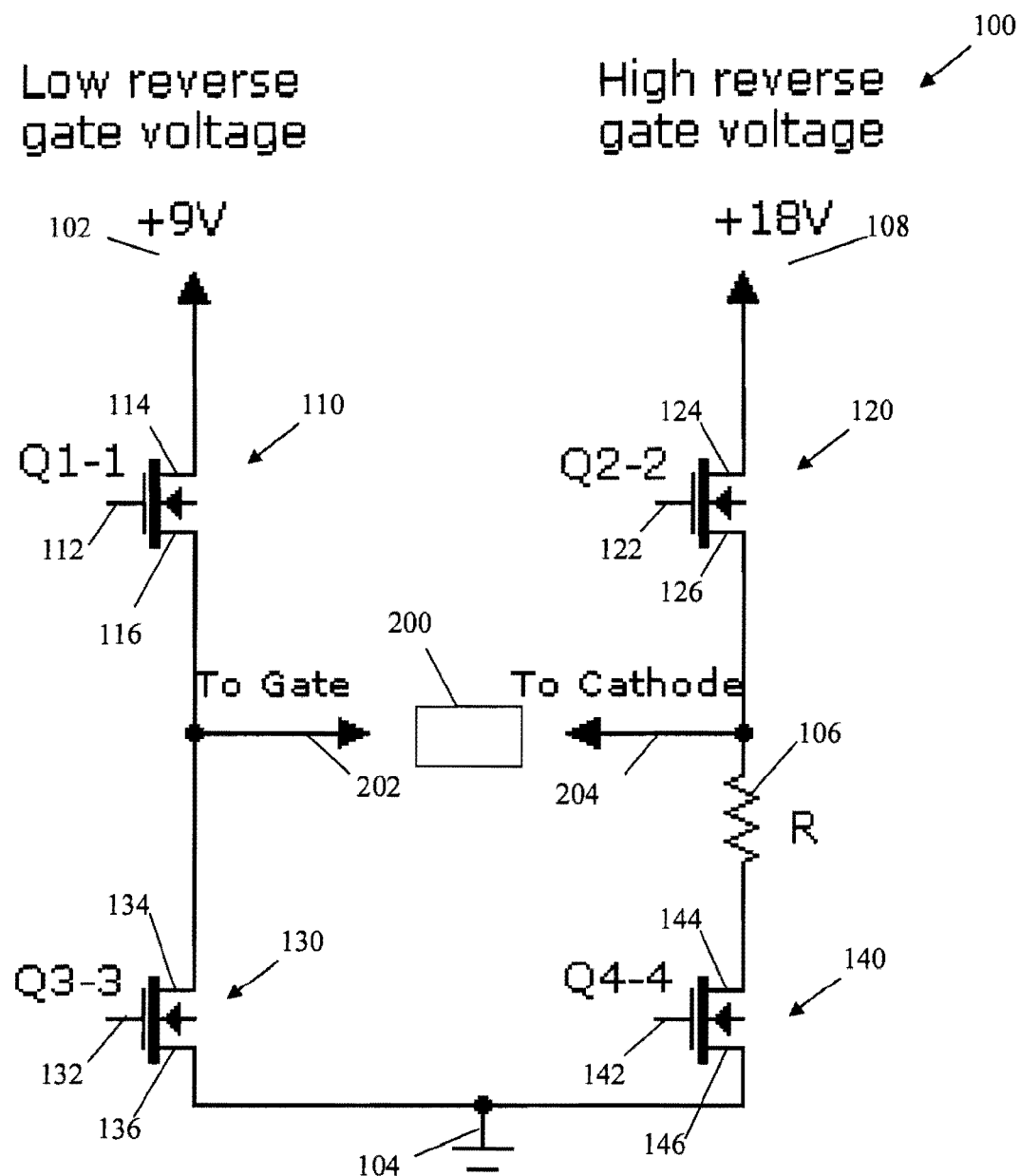
FIG. 1 is a circuit diagram for turning OFF a thyristor in accordance with an embodiment of the invention.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

Turning to the drawings, FIG. 1 is a non-limiting illustrative example of a circuit 100 used to increase the turn-OFF capability of a device, namely an SGTO. The circuit 100 includes a thyristor 200, four transistors 110, 120, 130, 140, a low reverse gate voltage power supply 102, and high reverse gate voltage power supply 108. The transistors 110, 120, 130, 140 can be any suitable switch or transistor including field effect transistors (FET) such as MOSFETs or IGFETs. The first, second, third and fourth transistors 110, 120, 130, 140 each have a respective gate 112, 122, 132, 142, drain 114, 124, 134, 144, and source 116, 126, 136, 146.

As shown, the low reverse gate voltage 102 is connected to the drain 114 of the first transistor 110. The source 116 of the first transistor 110 is connected to the drain 134 of the third transistor 130, and to the gate 202 of the thyristor 200 to be turned OFF. The source 136 of the third transistor 130 is connected to ground 104 and to the source 116 of the fourth transistor 140. The drain 144 of the fourth transistor is connected to a first end of the gate current liming resistor 106. A second end of the gate current liming resistor 106 is connected to the cathode 204 of the thyristor 200 and to the source 126 of the second transistor 120. The drain 124 of the second transistor 120 is connected to the high reverse gate voltage 108. The transistors 110, 120, 130, 140 are configured to operatively connect either or both of the low reverse gate voltage 102 and the high reverse gate voltage 108 across the gate and cathode junction 202, 204 of the thyristor device 200 being controlled, to turn the thyristor ON and OFF. The resistor 106 limits the turn-ON gate current.

Figure 2:
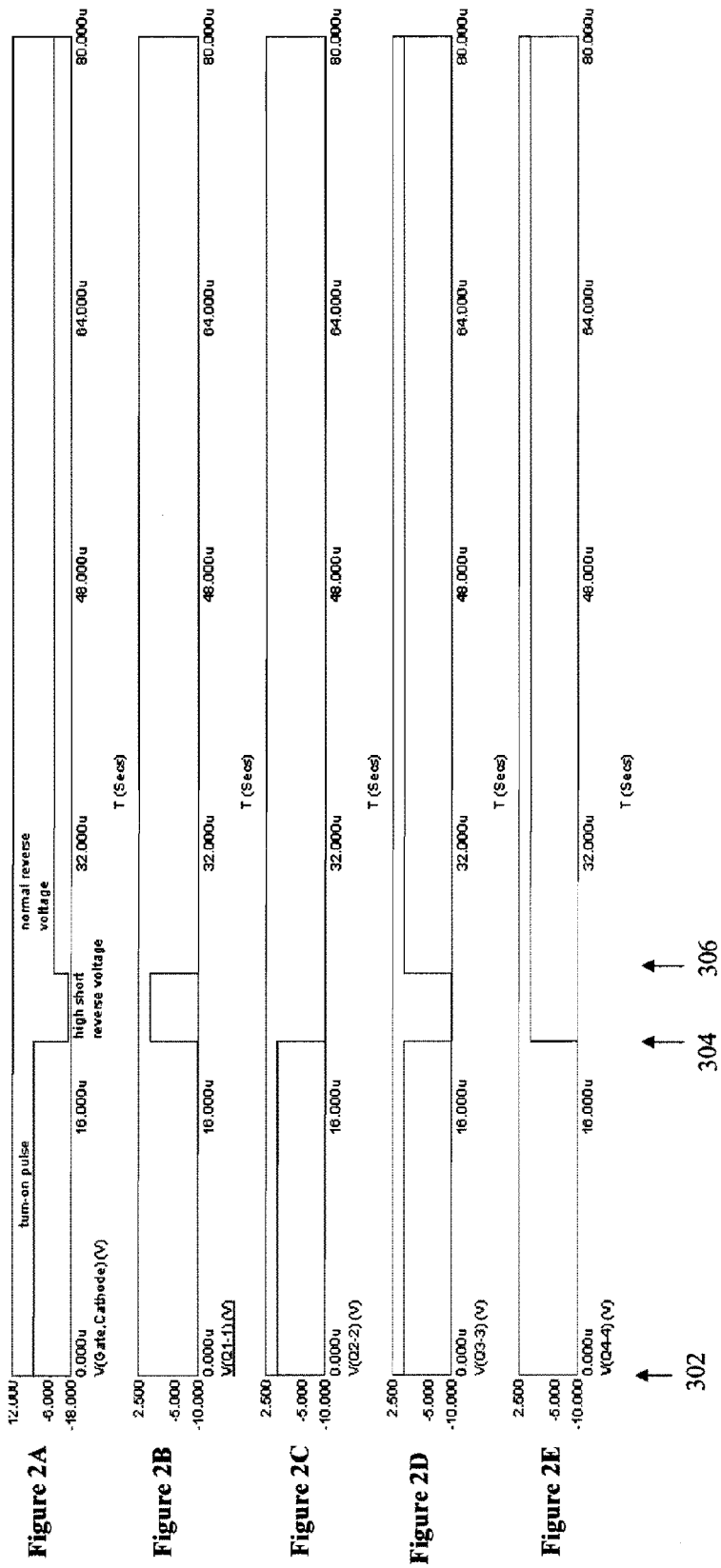
FIGS. 2A-2E are signal diagrams showing the timing of various pulses of the control circuit of FIG. 1.

The operation of the circuit 100 of FIG. 1 is best described with respect to the control signal pulses shown in FIG. 2. The voltage on the gate-cathode terminals 202, 204 of the thyristor 200 is shown in FIG. 2A. FIGS. 2B-2E show the voltage signals Q1-1, Q2-2, Q3-3, Q4-4 on the gates 112, 122, 132, 142 of the transistors 110, 120, 130, 140, respectively. The signals Q1-1, Q2-2, Q3-3, Q4-4 shown in FIGS. 2A-E are aligned vertically in the embodiment shown, to illustrate the respective timing of the signals with respect to each other.

Referring simultaneously to FIGS. 1 and 2, the gates Q1-1 and Q4-4 112, 142 are turned ON at a first time period 302 to create a turn-ON pulse. Thus, Q1-1 and Q4-4 are ON, so there is a low voltage across them, whereas Q2-2 and Q3-3 are OFF, so there is a high voltage across them. When the gates 112, 142 are turned ON, the turn-ON current flows through Q1-1, gate to cathode, gate current limiting resistor, and Q4-4. That, in turn, applies a turn-ON voltage across the gate and cathode terminals 202, 204. That turn-ON pulse turns ON the thyristor 200.

At the second time period 304, a turn-OFF pulse is generated to turn OFF the thyristor device 200. Here, the voltage is applied in reverse to the gate and cathode terminals 202, 204, so that the negative voltage turns OFF the thyristor 200. Accordingly. Q1-1 and Q4-4 (FIGS. 2B and 2E) are turned OFF and Q2-2 and Q3-3 (FIGS. 2C and 2D) are turned on, which applies the short high reverse gate voltage 108 pulse to the gate-cathode terminals 202, 204. The positive voltage goes to the cathode 204, and the negative voltage goes to the gate 202, which turns OFF the thyristor 202. The turn-OFF voltage pulse is applied for any suitable period of time, such as 1-2 microseconds in duration, and can be any suitable amplitude, such as −18 volts as shown in FIG. 2A. Because of the short period of time, the turn OFF voltage can exceed the avalanche value of the gate-cathode junction because this junction (being flooded with carriers) does not immediately block the voltage. Also, the device can thermally absorb the additional avalanche power dissipation for this short period of time.

At a third time period 306 following the high turn-OFF voltage pulse 108, a normal voltage is applied to the gate 202, such as −9-volts as shown in FIG. 2A. At that point, Q3-3 (FIG. 2D) is turned OFF and Q1-1 (FIG. 2B) is turned ON. That provides a 9-volt differential between the high reverse gate voltage 108 (of 18 volts) and the low reverse gate voltage (of 9 volts), which applies a 9-volt pulse to the thyristor gate 202 in the reverse direction. When Q3-3 and Q4-4 are OFF and Q1-1 and Q2-2 are ON, a normal reverse gate voltage of −9 volts (i.e., the high reverse gate voltage 108 minus the low reverse gate voltage 102) is applied to the Gate-Cathode terminals 202, 204.

Figure 3:
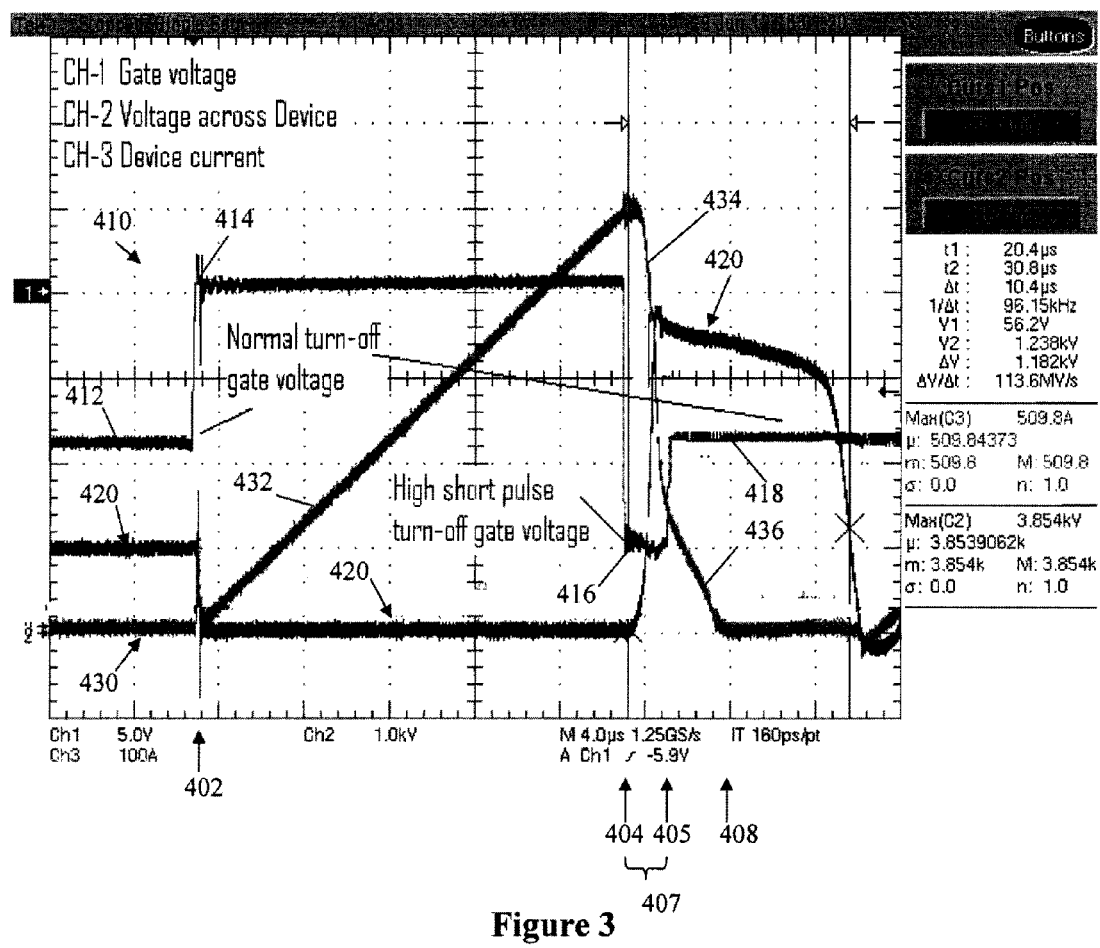
FIG. 3 is a pulse diagram for the circuit of FIG. 1, showing the initial short high reverse gate voltage pulse added to the normal turn OFF gate voltage.

Referring now to FIG. 3, the thyristor response to the signals of FIG. 2 is shown. In particular, FIG. 3 shows the gate voltage 410 at the thyristor gate 202, the thyristor voltage 420 (across the anode-cathode terminals of the thyristor) and the thyristor current 430. Starting at the left side of FIG. 3, gates 112 and 122 are ON and gates 132 and 142 are OFF, which results in the gate voltage 412 being a normal negative voltage (e.g., −9 volts). That keeps the thyristor 200 OFF until another turn-ON pulse is applied to the gate of the thyristor 200.

At time period 402, the gates 112 and 144 are turned ON. In response, the gate voltage 414 becomes positive (e.g., 9 volts in the embodiment shown) and the thyristor device 200 is turned ON. During that ON time, the voltage across the device 420 remains low, and the device current 432 rises. The thyristor 200 is kept ON until the turn-OFF pulse is applied on the gate of the thyristor 200. The device can fail at any time between 404 and 405 if the negative signal is not enough to keep the thyristor 200 OFF.

At the end of the first predetermined time period (i.e., period 404 in the embodiment of FIG. 3), the first and fourth gates 112, 142 are OFF and the second and third gates 122, 132 are turned ON. This results in the reverse high peak current voltage 416 from the high reverse voltage power supply 108 FIG. 1. Accordingly, this corresponds to 304-306 in FIG. 2, i.e., −18 volts being applied to the gate 202. This high voltage (−18 volts) increases the di/dt and amplitude of the negative gate current. In response, the device current 434 drops and the device 200 is turned OFF. The high peak turn-OFF current voltage 416 lasts for a second predetermined period of time, from time period 404 to time period 405, when the turn-OFF signal −9V applied on the gate of thyristor 200. Following that predetermined period of time, at time period 405, the gates 132 and 142 are turned OFF and the gates 112 and 122 are turned ON. In response, the gate voltage 418 is returned to a normal turn-OFF voltage (i.e., −9 volts) and stays OFF until another turn-ON pulse applies on the gate of the thyristor 200. Thus, the turn-OFF time 407 for the thyristor device 200 is represented by the difference between time periods 404 and 405 in FIG. 3.

In the illustrative non-limiting embodiment shown in FIG. 3, for the SGTO which has an avalanche of about 9V volts, the high peak turn-OFF voltage 416 is set at about 18 volts and the predetermined turn-OFF time 404-408 is less than about 5 microseconds and preferably about 2 microseconds. The normal turn-OFF voltage is preferably about −9 volts. In that case, the turn-OFF time for the thyristor device 200 is approximately 9 microseconds. Thus, the application of a high-peak reverse voltage 416, in combination with the normal reverse turn-OFF voltage 418 (i.e., −9 volts) results in a faster turn OFF time by approximately 4 microseconds.

Depending on a particular application and the device 200 being controlled, the user can vary the values for the normal turn OFF voltage, high reverse voltage 108, and the turn OFF time period 405. With normal turn-OFF gate voltage, the turn OFF capability of the SGTO was measured to be 360 A and with initial short high reverse gate voltage pulse, as shown on FIG. 3, the turn-OFF capability was greater than 509 A and can be as high as up to 600 A.

However, in certain applications the turn OFF voltage could be well over 18 volts, and the turn OFF period can be greater or less than 2 microseconds. For instance, where the GTO has a blocking capability of 25 volts, the normal turn OFF might be −20 volts and the high peak reverse voltage could be −40 volts. Still further, though a single high peak reverse turn-OFF voltage 108 is provided, it should be recognized that the turn-OFF voltage can step down over two or three periods of time. For instance, the turn-OFF voltage can be at a first level (e.g., −18 volts) for a first period (e.g., 1 microsecond), then at a second level (e.g., −14 volts) for a second period (e.g., 2 microseconds), then to the normal turn-OFF (e.g., −9 volts).

Some considerations in determining the maximum high peak gate turn-OFF voltage and pulse duration includes the features of the solid state switch to be turned OFF, such as the storage time, fall time and tail time of the thyristor 200. These dictate how much energy the device can accept during turn-OFF. The invention is suitable for any inductance of the gate drive circuit and inductance of the gate of the device.

Accordingly, to turn-OFF the thyristor device 200, the invention applies an initial short high reverse gate voltage pulse 416 (i.e., −18 volts) during turn OFF, which exceeds the normal reverse blocking voltage capability 412 (i.e., 9 volts) of the gate 202. This higher voltage applied at the initiation of the turn OFF (FIG. 2A, at time period 304), improves the turn OFF capability by increasing the gate current DIg/DT and the instantaneous value of the current flowing through the gate 202. Any suitable di/dt can be provided by changing the amplitude of the high short pulse. The circuit exceeds the reverse blocking capability of the gate 202 by limiting the duration (to approximately 2-3 microseconds) for the high voltage pulse to the time period where the gate is flooded with carriers and has not yet achieved a blocking state. That drives the gate current up very quickly. And, it is driven up higher due to the added driving voltage (18 volts compared to 9 volts). The high voltage, negative turn OFF voltage 108 exceeds the avalanche voltage of the gate-cathode junction 202, 204, and is applied before that junction enters avalanche mode and blocks voltage. Directly following the high reverse gate voltage pulse 416, the circuit 100 returns to provide a normal turn-OFF voltage 418 (i.e., −9 volts) to complete the turn-OFF of the device 200.

The invention provides several advantages, including a higher current turn-OFF capability, and looser turn-OFF storage time and switching losses. In addition, a higher inductance in the gate circuit 202 can be tolerated.

In addition, while the invention is shown as being implemented by transistors 110, 120, 130, 140, it can be implemented by any suitable circuit elements including analog, solid state and digital. For instance, the invention can be implemented by a processing device operated by software and having a memory storage device, and display. It is further noted that the application of the final normal turn-OFF voltage 418 ensures that the thyristor 200 remain OFF. However, it should be noted that this voltage can be higher or lower and need not be provided if the high turn-OFF voltage 416 substantially turns OFF the device 200.

Figure 4:
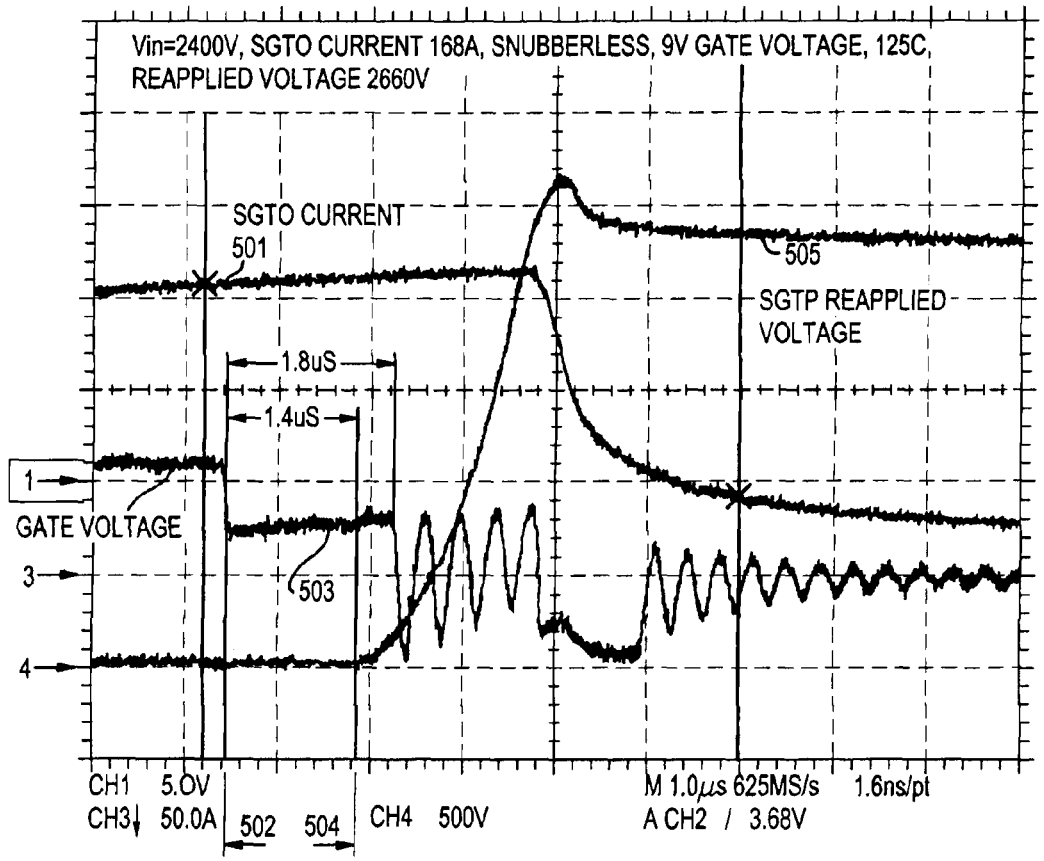
FIG. 4 is a diagram showing an SGTO turn-OFF by a standard −9 Volt signal.
Figure 5:
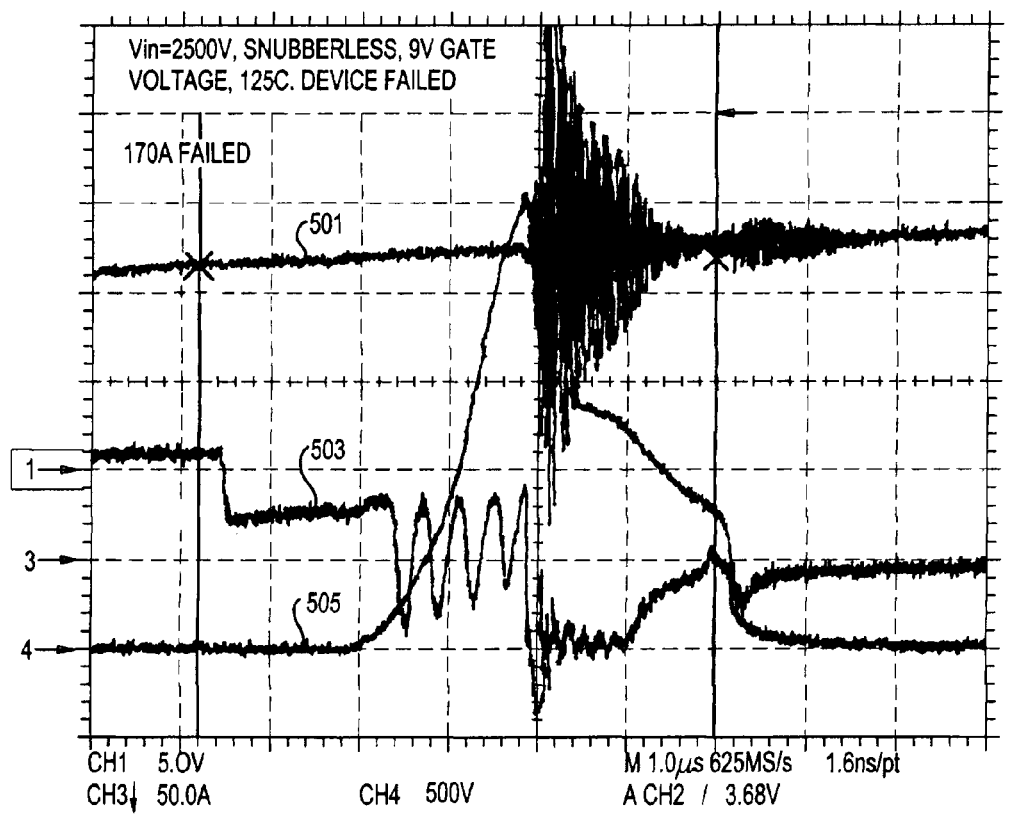
FIG. 5 is a diagram showing a −9 Volt turn-OFF of an SGTO, with device failure.

Turning to FIG. 4, a signal diagram is shown to illustrate the turn-OFF of an SGTO with a −9 volt gate voltage. The SGTO current 501, Gate voltage 503, and SGTO reapplied voltage 505 are shown. Here, the maximum SGTO current is 168 amps and the maximum SGTO reapplied voltage is 2,660 volts. At time 502 a gate voltage of −9 volts is applied. At 504 (1.4 μsec after 502) the SGTO starts to block voltage. At 1.8 μsec the emitter cleans out and oscillations start. When voltage across SGTO exceeds the source voltage at 3.25 μsec, the SGTO current begins to fall. This causes the emitter junction to avalanche and oscillations stop. At 4.4 μsec the emitter junction comes out of avalanche and the oscillation start again. In FIG. 5, the −9 volt signal is not enough to turn OFF the device, so the device fails.

Figure 6:
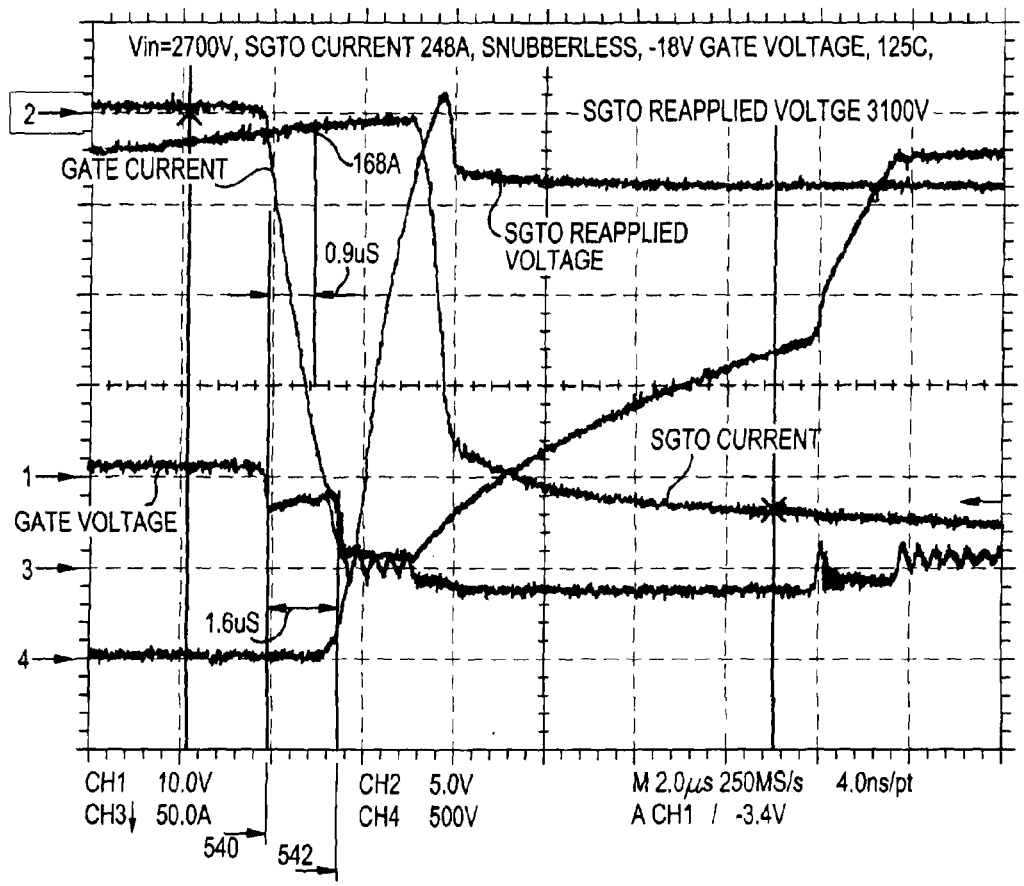
FIG. 6 is a signal diagram showing an −18 Volt turn-OFF for the SGTO of FIGS. 4 and 5.

Referring to FIG. 6, a −18 volt signal is applied to turn OFF the SGTO (instead of −9 volts) at time 540. At 1.2 μsec after 540 at 542 point the SGTO starts to block voltage. At 1.6 μsec the gate current exceeds the SGTO current and the emitter cleans out causing the oscillations to begin. When voltage across SGTO exceeds the source voltage at 3.2 μsec, the SGTO current begins to fall. Since the gate current cannot change instantaneously the difference between the gate current and the SGTO current avalanches the emitter junction and oscillations stop. At 12 μsec the −18 volts is reduced to −9 volts the emitter junction comes out of avalanche at 13.6 μsec and the oscillation starts again. Because −18 volts is used instead of −9 volts the DIg/DT (note that DIg/DT=gate voltage/gate circuit inductance) of the gate current is increased. Although not shown in FIG. 4, as explained for FIG. 6 the point at which oscillations begin is where the gate current exceeds the SGTO current. Since −18V doubles the DIg/DT of the gate current, the time for the gate to reach the SGTO current (168 A) is 0.9 μs. This is one half of 1.8 μs time shown on FIG. 4. For a given SGTO current, the increased DIg/DT reduces the storage time (and the turn-OFF time). Thus, the turn-OFF current capability in the present illustrative non-limiting embodiment is 248 amperes, and the reapplied voltage capability is 3,100 volts. It should be appreciated that the invention has higher turn-OFF speed, current and voltage capability, and is not limited by the illustrative values given here. Thus, the invention provides faster turn-OFF with a higher turn-OFF current capability and higher reapplied voltage capability.

Figure 7:
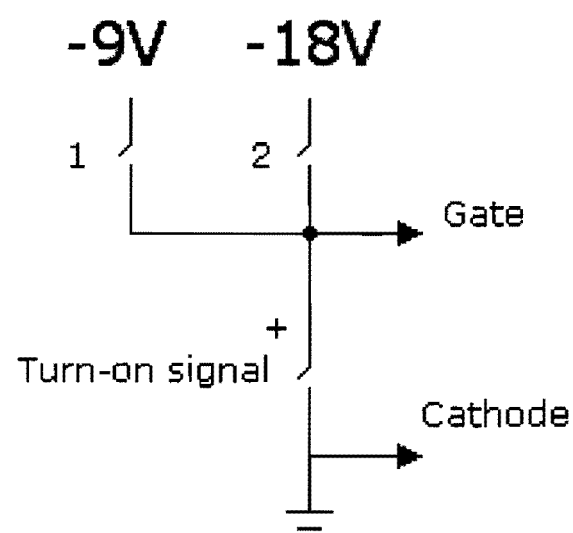
FIG. 7 is a circuit diagram showing the generic features of the invention.

Turning to FIG. 7, an alternative circuit is shown in accordance with the invention. In this illustrative non-limiting embodiment, the circuit includes two switches. The first switch is coupled with a normal −9 volt source, and the second switch is coupled with a high −18 volt source. A turn-ON signal switch is also provided. The switches can be operated to connect either the −9 volt or −18 volt supply to the gate and/or cathode of a device, to implement the operation of the present invention whereby a high −18 voltage signal is applied for a short period of time, followed by the −9 voltage signal to turn-OFF the device. For instance, to turn on the SGTO, the turn-ON signal is applied to the gate and cathode. To turn-OFF the SGTO, the −18V signal is applied for a given time duration and then the continuous −9V is applied across the gate and cathode. Still other circuits can be provided to implement the operation of the present invention, within the spirit and scope of the invention.

The foregoing description and drawings should be considered as illustrative only of the principles of the invention. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A circuit for turning OFF a thyristor having a gate, said circuit comprising:
    at least one first circuit element configured to provide a first reverse turn-OFF voltage to the thyristor gate for a predetermined period of time; and
    at least one second circuit element configured to provide a second reverse turn-OFF voltage to the thyristor gate following the predetermined period of time, wherein the second reverse turn-OFF voltage is substantially lower than the first reverse turn-OFF voltage.

2. The circuit of claim 1, wherein the second reverse turn-OFF voltage is about −9 volts, and the first reverse turn-OFF voltage is about −18 volts.

3. The circuit of claim 1, wherein the predetermined period of time is less than about 5 microseconds.

4. The circuit of claim 1, wherein the predetermined period of time is 2 microseconds.

5. The circuit of claim 1, wherein the at least one first circuit element comprises at least one first transistor.

6. The circuit of claim 5, wherein the at least one second circuit element comprises at least one second transistor.

7. The circuit of claim 1, wherein the at least one first circuit element comprises a first switch and the at least one second circuit element comprises a second switch.

8. The circuit of claim 1, wherein the gate of the thyristor does not enter avalanche mode.

9. The circuit of claim 1, wherein the second reverse turn-OFF voltage immediately follows the predetermined period of time.

10. The circuit of claim 1, wherein the first reverse turn-OFF voltage substantially reduces current in the thyristor.

11. A method for turning OFF a thyristor having a gate, said method comprising:
    providing by at least one first circuit element a high reverse turn-OFF voltage to the thyristor gate for a predetermined period of time; and providing by at least one second circuit element a normal reverse turn-OFF voltage to the thyristor gate immediately following the predetermined period of time, wherein the normal reverse turn-OFF voltage is substantially lower than the high reverse turn-OFF voltage.

12. A circuit for turning OFF a thyristor having a gate and a cathode, said circuit comprising:
- a low reverse gate voltage power supply;
- a high reverse gate voltage power supply;
- a first switch connected to the thyristor gate and the low reverse gate voltage power supply;
- a second switch connected to the thyristor cathode and the high reverse gate voltage power supply;
- a third switch connected to the thyristor gate; and
- a fourth switch connected to the thyristor cathode;
- wherein said circuit provides a high reverse turn-OFF voltage to the thyristor gate for a predetermined period of time when the first and fourth switches are OFF and the second and third switches are ON; and
- wherein said circuit provides a normal reverse turn-OFF voltage to the thyristor gate immediately following the predetermined period of time when the third and fourth switches are OFF and the first and second switches are ON, wherein the normal reverse turn-OFF voltage is substantially lower than the high reverse turn-OFF voltage.

* * * * *